US010103870B2

(12) United States Patent
Shibasaki

(10) Patent No.: US 10,103,870 B2
(45) Date of Patent: Oct. 16, 2018

(54) CDR CIRCUIT AND RECEPTION CIRCUIT

(71) Applicant: FUJITSU LIMITED, Kawasaki-shi, Kanagawa (JP)

(72) Inventor: Takayuki Shibasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/889,272

(22) Filed: Feb. 6, 2018

(65) Prior Publication Data

US 2018/0241540 A1 Aug. 23, 2018

(30) Foreign Application Priority Data

Feb. 20, 2017 (JP) ................................. 2017-029361

(51) Int. Cl.
*H04L 7/00* (2006.01)
*H04L 7/02* (2006.01)
*H03L 7/085* (2006.01)

(52) U.S. Cl.
CPC ................ *H04L 7/02* (2013.01); *H03L 7/085* (2013.01)

(58) Field of Classification Search
CPC .................................. H04L 7/02; H03L 3/085
USPC .......................................................... 375/371
See application file for complete search history.

(56) References Cited

U.S. PATENT DOCUMENTS

| 5,123,030 | A | | 6/1992 | Kazawa et al. | |
|---|---|---|---|---|---|
| 6,041,090 | A | * | 3/2000 | Chen | H03L 7/0891 327/148 |
| 8,791,735 | B1 | * | 7/2014 | Shibasaki | H03L 7/0812 327/147 |
| 2010/0054760 | A1 | * | 3/2010 | Fukuda | H03D 13/003 398/202 |
| 2012/0119801 | A1 | * | 5/2012 | Hsieh | H03L 7/087 327/156 |

(Continued)

FOREIGN PATENT DOCUMENTS

JP H03-016337 A 1/1991

OTHER PUBLICATIONS

Kurt H. Mueller et al.,"Timing Recovery in Digital Synchronous Data Receivers" IEEE Transactions on Communications, vol. COM-24, No. 5, pp. 516-531,May 1976(total 16 pages).

*Primary Examiner* — Helene Tayong
(74) *Attorney, Agent, or Firm* — Fujitsu Patent Center

(57) ABSTRACT

A CDR circuit includes a data-determination-circuit to determine a value of a data-signal, based on a first comparison-result of comparing the data-signal with first threshold-values at a timing of a clock-signal, a comparison-circuit to compare the data-signal with a second threshold-value at the timing to generate a second comparison-result, a phase-detection-circuit to detect data-patterns in which first to third symbols are temporally consecutive, based on a determination-result, the data-patterns forming that a value of the second symbol is larger than the first symbol and smaller than the third symbol, or the in value of the second symbol is smaller than the first symbol and larger than the third symbol, wherein the phase-detection-circuit generates a phase-difference-signal for controlling a phase of the clock-signal to advance or delay, based on the second comparison-result at the second symbol, and a phase-adjustment-circuit to adjust the phase of the clock-signal based on the phase-difference-signal.

7 Claims, 16 Drawing Sheets

(56) References Cited

U.S. PATENT DOCUMENTS

| | | | |
|---|---|---|---|
| 2012/0170692 A1* | 7/2012 | Sunaga | H04L 7/0334 |
| | | | 375/340 |
| 2014/0010337 A1* | 1/2014 | Staszewski | H03C 3/0966 |
| | | | 375/376 |
| 2014/0286381 A1* | 9/2014 | Shibasaki | H03L 7/089 |
| | | | 375/226 |
| 2015/0092898 A1* | 4/2015 | Lee | H04L 7/0062 |
| | | | 375/354 |

* cited by examiner

FIG. 6

| Do[0] | Do[1] | Do[2] | PL[1] | PH[1] | UPDN[3:2] |
|---|---|---|---|---|---|
| 0 | 1 | 2 | 0/1 | 0 | DN/UP |
| 0 | 1 | 3 | 0/1 | 0 | DN/UP |
| 0 | 2 | 3 | 1 | 0/1 | DN/UP |
| 1 | 2 | 3 | 1 | 0/1 | DN/UP |
| 2 | 1 | 0 | 0/1 | 0 | UP/DN |
| 3 | 1 | 0 | 0/1 | 0 | UP/DN |
| 3 | 2 | 0 | 1 | 0/1 | UP/DN |
| 3 | 2 | 1 | 1 | 0/1 | UP/DN |
| Other | | | | | STAY |

CDR CIRCUIT AND RECEPTION CIRCUIT

CROSS-REFERENCE TO RELATED APPLICATION

This application is based upon and claims the benefit of priority of the prior Japanese Patent Application No. 2017-029361, filed on Feb. 20, 2017, the entire contents of which are incorporated herein by reference.

FIELD

The embodiments discussed herein are related to the clock data recovery (CDR) circuit and a reception circuit.

BACKGROUND

As the performance of an information processing device such as a server, or the large scale integrated circuit (LSI) device has been improved, the data rate of data signals transmitted and received between the devices or within the device has increased. However, the improvement of an operation speed of a circuit or a device within the device becomes strict recently, so that a multi-level transmission technology, such as the pulse amplitude modulation 4 (PAM4), is proposed to be adopted as a technology for improving the data rate without increasing an operation speed. When the same amount of information as the non return to zero (NR) is transmitted in the PAM4, the change speed (baud rate) of data signals may become halved.

However, in a reception circuit used in an information processing device or an LSI device, the CDR that reproduces a value (data) and a clock signal from a transmitted data signal is performed. In the CDR, in order to determine the value with appropriate timing, a phase detecting circuit for detecting the phase difference between a sampling clock signal for sampling a data signal and a data signal is used.

The phase detecting circuit includes a phase detecting circuit in the mueller-muller (MM) type which detects the phase difference by 1× sampling, and a phase detecting circuit in the bang-bang (BB) type which detects the phase difference by 2× sampling. Further, the 1× sampling indicates one time sampling for one symbol (which is also called one unit interval (UI)) of a data signal. The 2× sampling indicates two time sampling for one symbol of a data signal. The data signal of the NRZ has a value of 1 bit per symbol, and the data signal of the PAM4 has a value of 2 bits per symbol.

Related technologies are disclosed in, for example, Japanese Laid-Open Patent Publication No. 03-016337.

Related technologies are disclosed in, for example, K. H. Mueller to and M. Muller, "Timing Recovery in Digital Synchronous Data Receivers," IEEE Transactions on Communications, vol. COM-24 pp, 516-531, May 1976.

SUMMARY

According to an aspect of the invention, a clock data recovery circuit includes a data determination circuit configured to determine a value of a data signal, based on a first comparison result of comparing the data signal with three or more first threshold values at a timing synchronized with a clock signal so as to generate a determination result, the data signal having data on which two or more bits are matched to a plurality of electric potential levels into which an electric potential of the data signal is divided by the three or more first threshold values, a first comparison circuit configured to compare the data signal with a second threshold value at the timing synchronized with the clock signal so as to generate a second comparison result, a first phase detection circuit coupled with the data determination circuit and the first comparison circuit, and configured to detect data patterns in which a first symbol, a second symbol and a third symbol of a plurality of symbols to which the data signal is modulated are temporally consecutive, based on the determination result, the data patterns forming that a value of the second symbol is larger than a value of the first symbol and smaller than a value of the third symbol, or the value of the second symbol is smaller than the value of the first symbol and larger than the value of the third symbol, wherein, when the first phase detection circuit detects the data pattern, the first phase detection circuit generates a first phase difference signal for controlling a phase of the clock signal to advance or delay, based on the second comparison result at the second symbol, and a phase adjustment circuit configured to adjust the phase of the clock signal, based on the first phase difference signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram illustrating an example of a truth value table indicating an input/output of a slope detecting circuit;

DESCRIPTION OF EMBODIMENTS

In a reception circuit that receives multi-level signals, there are many values for determination and various patterns of data transition exist, so that the number of threshold values for determining a value or the number of threshold values for detecting a phase difference is larger than the number of the reception circuits which receive data signals of the non return to zero (NRZ). Accordingly, the number of comparing circuits which compare the threshold values and the multi-level signal is also larger than that the number of the reception circuits which receive a data signal of the NRZ. When the number of comparing circuits is increased, power consumption is increased due to an increase in a clock buffer of pass propagated by a clock signal that drives each comparing circuit, an increase in an amplifier that amplifies a data signal supplied to each comparing circuit, or the like.

The number of comparing circuits may be decreased by decreasing the number of threshold values for detecting the phase difference and detecting the phase difference in the case where specific data transition is detected. However, in this case, the detection rate that is a probability of detecting the phase difference (a probability of occurrence of phase difference detection) is decreased, and tracking performance of the reception circuit for a multi-level signal is degraded, so that there is a case where it is difficult to decrease the to number of comparing circuits and power consumption is increased.

Hereinafter, an embodiment for implementing a technology for a clock data recovery (CDR) circuit and a reception circuit which are capable of decreasing power consumption will be described with reference to the drawings.

First Embodiment

Figure 1:
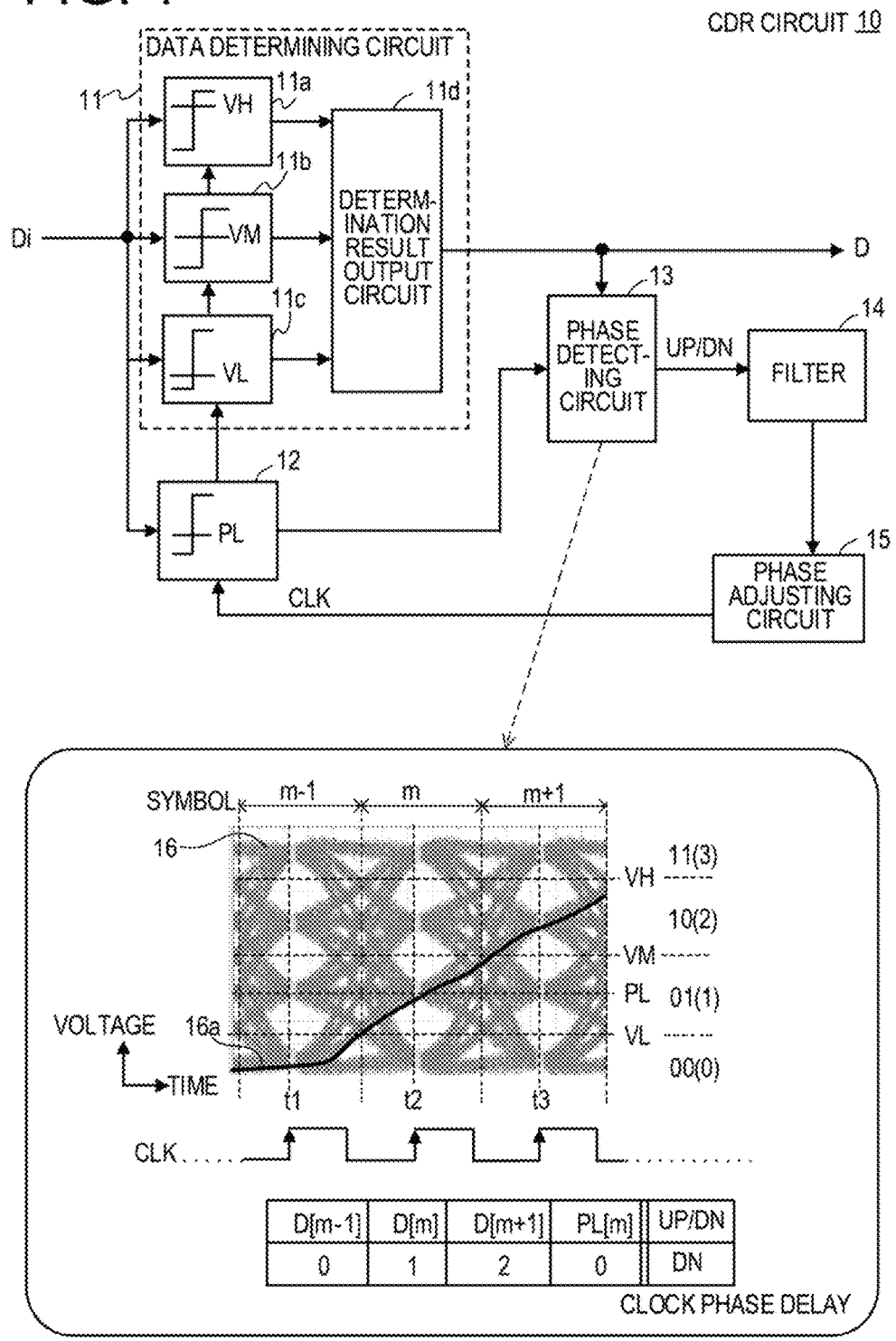
FIG. 1 is a diagram illustrating an example of a CDR circuit of a first embodiment.

FIG. 1 is a diagram illustrating an example of a CDR circuit of a first embodiment. A CDR circuit 10 of the first embodiment includes a data determining circuit 11, a comparing circuit 12, a phase detecting circuit 13, a filter 14, and a phase adjusting circuit 15. The data determining circuit 11 receives a data signal Di in which a value of 2 bits or more is associated with each of a plurality of potential levels divided by three or more threshold values. Further, the data determining circuit 11 determines the value of the data signal Di based on a comparison result obtained by comparing the threshold value with the data signal Di at the timing synchronized to a clock signal CLK, and outputs a determination result D.

FIG. 1 illustrates an example of the data determining circuit 11 which determines the value of the data signal Di (the data signal Di of PAM4) having a value of 2 bits per symbol (1 UI) by using three threshold values VH, VM, and VL. The data determining circuit 11 receives the data signal Di of PAM4 in which a 2-bit value is associated with each of the four potential levels divided by threshold values VH, VM and VL, and outputs the determination result D of the 2-bit value.

When it is assumed that the four potential levels of the data signal Di are L0, L1, L2, and L3 in an ascending order, for example, "00" is associated with L0, "01" is associated with L1, "10" is associated with L2, and "11" is associated with L3. Further, a threshold value of a boundary dividing L0 and L1 is a threshold value VL, a threshold value of a boundary dividing L1 and L2 is a threshold value VM, and a threshold value of a boundary dividing L2 and L3 is a threshold value VH. The difference (voltage difference) between the threshold to value VM and the threshold value VH is the same as the difference between the threshold value VM and the threshold value VL.

Hereinafter, there is a case where the 2-bit values are called decimal numbers, such as 0, 1, 2, and 3, in an ascending order. However, an enumeration of the 2-bit values allocated to the L0 to L3, respectively, may be a gray code. The gray code has a characteristic that a signal distance between adjacent codes is 1. For example, "00" is associated with L0, "01" is associated with L1, "11" is associated with L2, and "10" is, associated with L3 so that the enumeration of the 2-bit values allocated to the L0 to L3, respectively, is the gray code. By using the gray code, it is possible to prevent a potential of a signal from being changed due to an application of noise while the signal is transmitted and prevent a read error from being recognized as a 2-bit error when the error of the read of an adjacent code at a receiving side is generated.

The center threshold value VM among the three threshold values VL, VM, and VH is a center of, a change in amplitude of the data signal Di, and is, for example, 0 V. Further, when the voltage of the data signal Di is changed from −1 to +1 the threshold value VH is +2/3, the threshold value VL is −2/3, and the like.

The data determining circuit 11 includes comparing circuits 11a, 11b, and 11c, and, a determination result output circuit 11d. The comparing circuit 11a outputs the result of a comparison between the data signal Di and the threshold value VH. For example, when the data signal Di is larger than the threshold value VH, the comparing circuit 11a outputs 1 (or a signal of which a logic level is a high (H) level), and when the data signal Di is smaller than the threshold value VH, the comparing circuit 11a outputs 0 (or a signal of which a logic level is a low (L) level).

The comparing circuit 11b outputs the result of a comparison between the data signal Di and the threshold value VM. For example, when the data signal Di is larger than the threshold value VM, the comparing circuit 11b outputs 1 (or a signal of which the logic level is the H level), and when the data signal Di is smaller than the threshold value VM, the comparing circuit 11b outputs 0 (or the signal of which the logic level is the L level).

The comparing circuit 11c outputs the result of a comparison between the data signal Di and the threshold value VL. For example, when the data signal Di is larger than the threshold value VL, the comparing circuit 11c outputs 1 (or a signal of which the logic level is the H level), and when the data signal Di is smaller than the threshold value VL, the comparing circuit 11b outputs 0 (or the signal of which the logic level is the L level).

The determination result output circuit 11d outputs a 2-bit value of each symbol of the data signal Di as a determination result D based on the comparison results output by the comparing circuits 11a to 11c. For example, when all of the comparison results output by the comparing circuits 11a to 11c are 1, the determination result output circuit 11d outputs "11". When the comparison result output by the comparing circuit 11a is "0" and the comparison result output by the comparing circuits 11b and 11c is "1", the determination result output circuit 11d outputs "10". When the comparison results output by the comparing circuits 11a and 11b are "0" and the comparison result output by the comparing circuit 11c is "1", the determination result output circuit 11d outputs "01". When all of the comparison results output by the comparing circuits 11a to 11c is 0, the determination result output circuit 11d outputs "00".

The comparing circuit 12 outputs the result of the comparison between the data signal Di and a threshold value PL at a timing synchronized to the clock signal CLK. The threshold value PL is a threshold value for detecting a phase difference, and for example, the threshold value PL is set with a value (voltage value) having an intermediate size of the threshold value VM and the threshold value VL. For example, when the data signal Di is larger than the threshold value PL, the comparing circuit 12 outputs 1 (or a signal of which the logic level is the H level), and when the data signal Di is smaller than the threshold value PL, the comparing circuit 12 outputs 0 (or the signal of which the logic level is the L level). Further, the comparing circuit 12 may use a threshold value (hereinafter, referred to as "the threshold value PH") that is a value having an intermediate size of the threshold value VM and the threshold value VH, instead of using the threshold value PL.

Two comparing circuits may be provided, and one of the two comparing circuit may output the result of the comparison between the data signal Di and the threshold value PL and the other may output the result of the comparison between the data signal Di and the threshold value PH. The phase detecting circuit 13 detects a data pattern in which values of three consecutive symbols are shifted in a slope shape, based on the result of the determination of the data determining circuit 11 for each of continuous first symbol, second symbol, and third symbol.

The data pattern in which the values of the three consecutive symbols are shifted in the slope shape is a data pattern in which a value of the first symbol is smaller than a value of the second symbol and a value of the third symbol is larger than the value of the second symbol, or the value of the first symbol is larger than the value of the second symbol and the value of the third symbol is smaller than the value of the second symbol. For example, as illustrated in FIG. 1, when the threshold value PL is used in the comparing circuit 12, the phase detecting circuit 13 detects four data patterns in which the values of the three consecutive symbols are (0, 1, and 2), (0, 1, and 3), (2, 1, and 0), and (3, 1, and 0). When the threshold value PH is used in the comparing circuit 12, the phase detecting circuit 13 detects four data patterns in which the values of the three consecutive symbols are (0, 2, and 3), (1, 2, and, 3), (3, 2 and 0), and (3, 2, and 1).

When the phase detecting circuit 13 detects the data pattern in which the values of the three consecutive symbols are shifted in the slope shape, the phase detecting circuit 13 outputs a phase difference signal UP/DN based on the result of the comparison of the comparing circuit 12 in the second symbol that is temporally in the middle among the three symbols. The phase difference signal UP/DN is a signal indicating whether to advance or delay the phase of a clock signal CLK. In order to accurately determine the value of the data signal Di, the phase of a rising or falling edge of the clock signal CLK that is the determination timing may be matched with the phase of a center of an eye of an eye pattern by the data signal Di. The phase detecting circuit 13 determines a mismatch (phase difference) of the phase of the rising or falling edge of the clock signal CLK to the phase of the center of the eye of the eye pattern by the data signal Di based on the result of the comparison by the comparing circuit 12. Further, the phase detecting circuit 13 outputs the phase difference signal UP/DN for correcting the phase difference.

The filter 14 generates an adjustment signal by filtering the phase difference signal UP/DN. Further, the filter 14 is not limited to a digital filter, and may be a circuit which includes a charge pump and the like adjusting a current value according to the phase difference signal UP/DN, converts the adjusted current value to a voltage value, and outputs the voltage value as an adjustment signal.

The phase adjusting circuit 15 outputs the clock signal CLK of which the phase is adjusted based on the adjustment signal output by the filter 14. The phase adjusting circuit 15 is implemented by using, for example, a voltage-controlled oscillator (VCO) and a phase interpolation circuit (phase interpolator).

Hereinafter, an example of the phase difference detection by the CDR circuit 10 of the first embodiment will be described. In FIG. 1, the entire transition of the data signal Di of PAM4 at three consecutive symbols m−1, m, and m+1 is indicated by an eye pattern 16. The vertical axis represents a voltage, and the horizontal axis represents time. The data signal Di indicated by a waveform 16a has 0, 1, and 2 that are values of symbols m−1, m, and m+1, so that the data signal Di is shifted in a slope shape. The symbols D[m−1], D[m], and D[m+1] in FIG. 1 indicate determination results of the values at determination timings (timings t1, t2, and t3 of the rise of the clock signal CLK) to at the symbols m−1, m, and m+1. Further, the symbol PL[m] indicates a comparison result by the comparing circuit 12 at the determination timing (timing t2) at the symbol m.

When the phase detecting circuit 13 detects a data pattern, such as the waveform 16a, the phase detecting circuit 13 outputs the phase different signal UP/DN based on the comparison result by the comparing circuit 12 at the symbol m that is the temporally center among the three symbols m−1, m, and m+1.

In the example of FIG. 1, the data signal Di at the timing t2 is smaller than the threshold value PL. This indicates that the phase of the clock signal CLK is advanced with respect to the phase of the center of the eye of the eye pattern of the data signal Di. In this case, the comparing circuit 12 outputs 0 as PL[m], and the phase detecting circuit 13 outputs a signal DN indicating the delay of the phase of the clock signal CLK as the phase difference signal UP/DN. The filter 14 outputs an adjustment signal based on the signal DN, and the phase adjusting circuit 15 delays the phase of the clock signal CLK.

Figure 2:
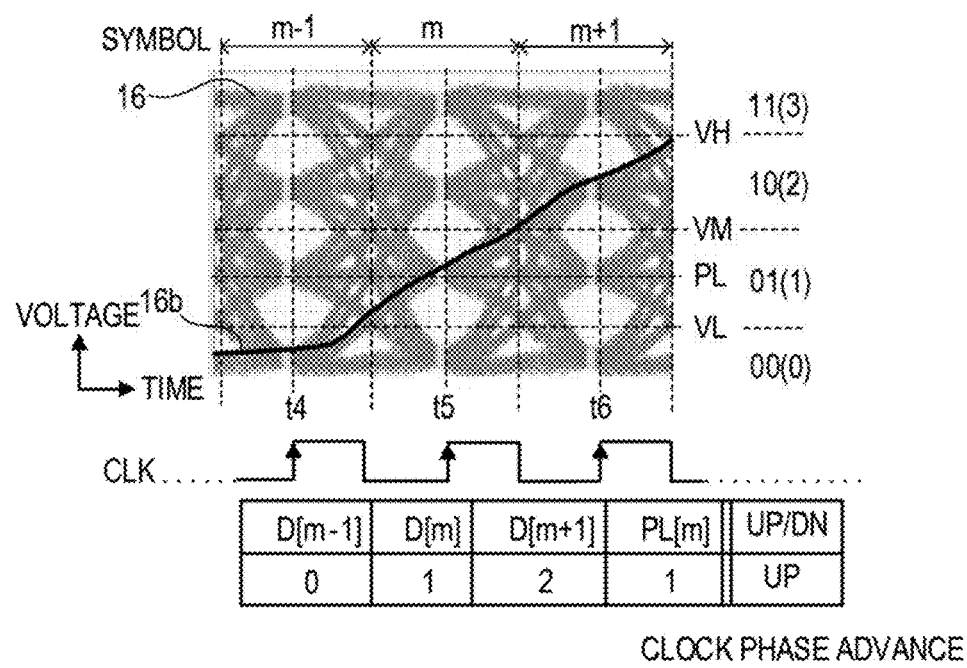
FIG. 2 a diagram illustrating an example of phase difference detection in the case where the phase of a clock signal is advanced.

FIG. 2 is a diagram illustrating an example of phase difference detection in the case where a phase of a clock signal is advanced. The vertical axis represents a voltage, and the horizontal axis represents time. In FIG. 2, the entire transition of the data signal Di of the PAM4 at three consecutive symbols m−1, m, and m+1 is also indicated by the eye pattern 16. Further, in the data signal Di indicated by a waveform 16b, values of the symbols m−1, m, and m+1 determined at timings t4, t5, and t6 are 0, 1, and 2, and are shifted in a slope shape.

In the example of FIG. 2, the waveform 16b of the data signal Di at the determination timing (timing t5) of the symbol m is larger than the threshold value PL. This indicates that the phase of the clock signal CLK is delayed with respect to the phase of the center of the eye of the eye pattern of the data signal Di. In this case, the comparing circuit 12 outputs 1 as PL[m], and the phase detecting circuit 13 outputs a signal UP indicating the advance of the phase of the clock signal CLK as the phase difference signal UP/DN. The filter 14 outputs an adjustment signal based on the signal UP, and the phase adjusting circuit 15 advances the phase of the clock signal CLK.

The signals DN and UP are indicated by 2-bit signals. For example, the signal DN is "01", and the signal UP is "11".

In the foregoing CDR circuit 10, in the case where the values of the three consecutive symbols are the four data patterns described above, the phase difference signal UP/DN is output based on the comparison result output by the comparing circuit 12. That is, in the case where the four data patterns are detected, the phase difference detection is performed. A detection rate that is a probability of detecting a phase difference is obtained as described below.

There are 64 data patterns that the values of the three consecutive symbols may take. In the CDR circuit 10, the phase difference detection is performed in the case where four data patterns among 64 patterns are detected for each symbol, so that the detection rate is $3 \times 4/64 = 12/64 = 3/16$.

In this respect, a detection rate in the case where the MM-type phase detecting circuit is used is described below. The MM-type phase detection circuit performs a phase difference detection based on the result of the comparison between the data signal Di at two continuous symbols and a plurality of threshold values. When the data signal Di of PAM4 is used, the number of comparing circuits may be decreased by decreasing the number of threshold values for detecting a phase difference and detecting the phase difference when a specific data transition is detected.

Figure 3:
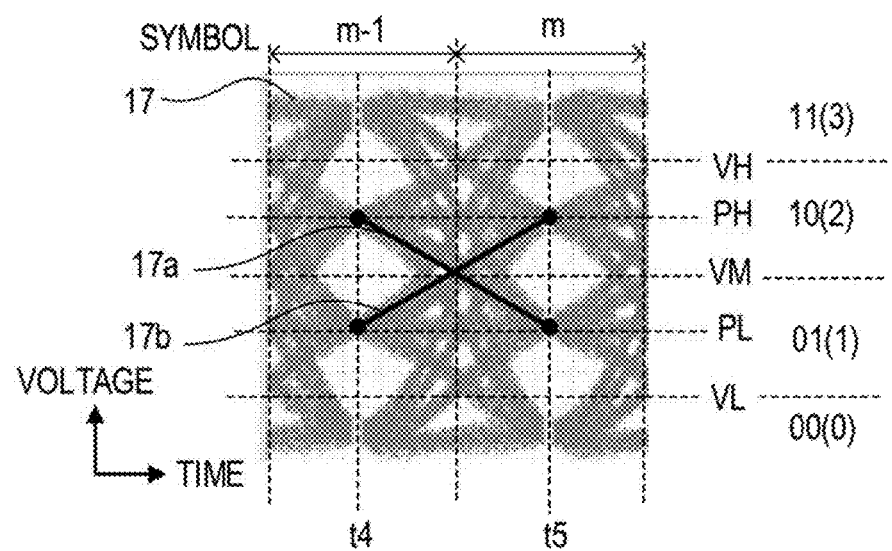
FIG. 3 is a diagram illustrating a detection rate of phase difference detection by an MM-type phase detecting circuit.

FIG. 3 is a diagram illustrating the detection rate of the phase difference detection by the MM-type phase detecting circuit. The vertical axis represents a voltage, and the horizontal axis represents time. In FIG. 3, the entire transition of the data signal Di of PAM4 at two continuous symbols m−1 and m is indicated by an eye pattern 17. Further, straight lines 17a and 17b indicate data patterns in which the values of the symbols m−1 and m are changed by two types including 1 and 2 or 2 and 1.

The MM-type phase detecting circuit compares the data signal Di and threshold values VL, VM, VH, PL, and PH at the determination timings (timings t4 and t5) of the data at the symbol m−1 and the symbol m, and outputs a phase difference signal UP/DN based on a result of the comparison. Further, an example of the phase difference detection by the MM-type phase detecting circuit will be described below.

In the MM-type phase detecting circuit, the number of comparing circuits which compare each threshold value with the data signal Di is five (ten in the case where the MM-type phase detecting circuit performs a half rate operation). Further, there are 16 data patterns that the values of the two continuous symbols may take, and in the MM-type phase detecting circuit, the phase difference detection is performed in the case where two data patterns among the 16 patterns are detected for every two symbols, so that a detection rate is $2/16$.

Although not illustrated, the same relationship between the number of comparing circuits and a detection rate is applied to the BB-type phase detecting circuit. In the CDR circuit 10 of the first embodiment, the number of comparing circuits is four (eight in the case where the half rate operation is performed) as illustrated in FIG. 1, and even when the number of comparing circuits of the CDR circuit 10 is smaller than that of the MM-type or BB-type phase detecting circuit, the detection rate is $3/16$, which is higher than that of the MM-type or BB-type phase detecting circuit.

That is, the CDR circuit 10 of the first embodiment may suppress detection rate from being decreased even when the number of comparing circuits for detecting the phase difference detection is decreased compared to the MM-type and BB-type phase detecting circuit in the related art. Accordingly, it is possible to decrease the number of comparing circuits and decrease power consumption.

Second Embodiment

Figure 4:
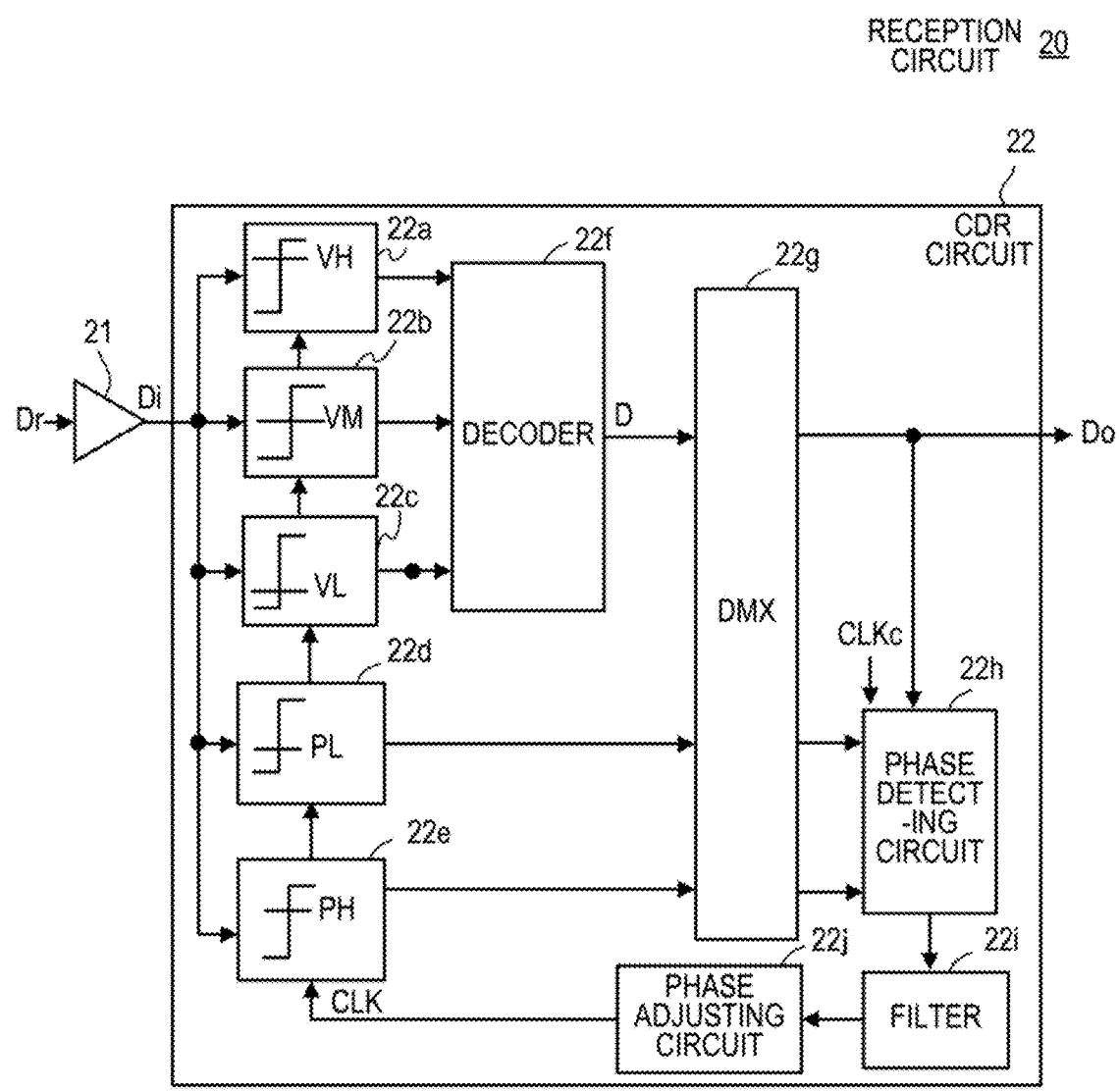
FIG. 4 is a diagram illustrating an example of a CDR circuit and a reception circuit according to a second embodiment

FIG. 4 is a diagram illustrating an example of a CDR circuit and a reception circuit according to a second embodiment. A reception circuit 20 of the second embodiment includes an equalization circuit 21 and a CDR circuit 22.

The equalization circuit 21 receives a data signal Dr of PAM4 in which a 2-bit value is associated with each of four potential levels divided by threshold values VH, VM, and VL, performs equalization processing on the data signal Dr, and outputs a data signal Di. For example, a continuous-time linear equalizer (CTLE) may be used as the equalization circuit 21.

The CDR circuit 22 includes comparing circuits 22a, 22b, 22c, 22d, and 22e, a decoder 22f, a demultiplexer (indicated by DMX in FIG. 4) 22g, a phase detecting circuit 22h, a filter 22i, and a phase adjusting circuit 22j.

By the comparing circuits 22a to 22c and the decoder 22f, the same function as that of the data determining circuit 11 of FIG. 1 is implemented. The comparing circuit 22a outputs the result of a comparison between the data signal Di and the threshold value VH at a timing synchronized to a clock signal CLK. The comparing circuit 22a outputs 1 when the data signal Di is larger than the threshold value VH, and outputs 0 when the data signal Di is smaller than the threshold value VH.

The comparing circuit 22b outputs the result of the comparison between the data signal Di and the threshold value VM at the timing synchronized to the clock signal CLK. The comparing, circuit 22b outputs 1 when the data signal Di is larger than the threshold value VM, and outputs 0 when the data signal Di is smaller than the threshold value M.

The comparing circuit 22c outputs the result of the comparison between the data signal Di and the threshold value VL at the timing synchronized to the clock signal CL. The comparing circuit 22c outputs 1 when the data signal Di is larger than the threshold value VL, and outputs 0 when the data signal Di is smaller than the threshold value VL.

The decoder 22f outputs a 2-bit value of each symbol of the data signal Di as a determination result D based on the comparison results output by to the comparing circuits 22a to 22c. When all of the comparison results output by the comparing circuits 22a to 22c is "1", the decoder 22f outputs "11" (3 as a decimal number). When the comparison result output by the comparing circuit 22a is "0" and the comparison results output by the comparing circuits 22b and 22c are "1", the decoder 22f outputs "10" (2 as a decimal number). When the comparison results output by the comparing circuits 22a and 22b are "0" and the comparison result output by the comparing circuit 22c is "1", the decoder 22f outputs "01" (1 as a decimal number). When all of the comparison results output by the comparing circuits 22a to 22c is "0", the decoder 22f outputs "00" (0 as a decimal number).

The comparing circuit 22d outputs the result of the comparison between the data signal Di and the threshold value PL at the timing synchronized to the clock signal CLK. The comparing circuit 22d outputs 1 when the data signal Di is larger than the threshold value PL, and outputs 0 when the data signal Di is smaller than the threshold value PL.

The comparing circuit 22e outputs the result of the comparison between the data signal Di and the threshold value PH at the timing synchronized to the clock signal CLK. The comparing circuit 22e outputs 1 when the data signal Di is larger than the threshold value PH, and outputs 0 when the data signal Di is smaller than the threshold value PH.

Further, in the case where the CDR circuit 22 performs a half rate operation, two of each of the comparing circuits 22a to 22e are provided. The demultiplexer 22g demultiplexes each of the determination result D and the comparison results output by the comparing circuits 22d and 22e to the number of bits of n symbol portions (n≥4). For example, the number of bits of the n symbol portions is set according to a processing capability (which is determined by the frequency of an operation clock signal CLKc) of the phase detecting circuit 22h implemented by a digital circuit.

The phase detecting circuit 22h receives an output data signal Do of the n symbol portions output by the demultiplexer 22g. Then, the phase detecting circuit 22h detects a data pattern in which the values of the three consecutive symbols are shifted in a slope shape, based on the output data signal Do. The phase detecting circuit 22h detects eight data patterns in which the values of the three consecutive symbols are (0, 1, and 2), (0, 1, and 3), (0, 2, and 3), (1, 2, and 3), (2, 1 and 0), (3, 1, and 0), (3, 2, and 0), and (3, 2 and 1).

When the phase detecting circuit 22h detects the data patterns in which the values of the three consecutive symbols are shifted in the slope shape, the phase detecting circuit 22h performs phase difference detection based on the comparison results of the comparing circuits 22d and 22e at the temporally center symbol among the three symbols. The phase detecting circuit 22h outputs a phase difference signal UP/DN as a result of the phase difference detection.

The filter 22i generates an adjustment signal by filtering the phase difference signal UP/DN. Further, the filter 22i is not limited to a digital filter, and may be a circuit which includes, for example, a charge pump adjusting a current value according to the phase difference signal UP/DN, converts the adjusted current value to a voltage value, and outputs the voltage value as an adjustment signal.

The phase adjusting circuit 22j outputs the clock signal CLK of which the phase is adjusted based on the adjustment signal output by the filter 22i. The phase adjusting circuit 22j is implemented by using, for example, a VCO and a phase interpolating circuit.

(Example of the Phase Detecting Circuit 22h and Example of Phase Difference Detecting Operation)

Figure 5:
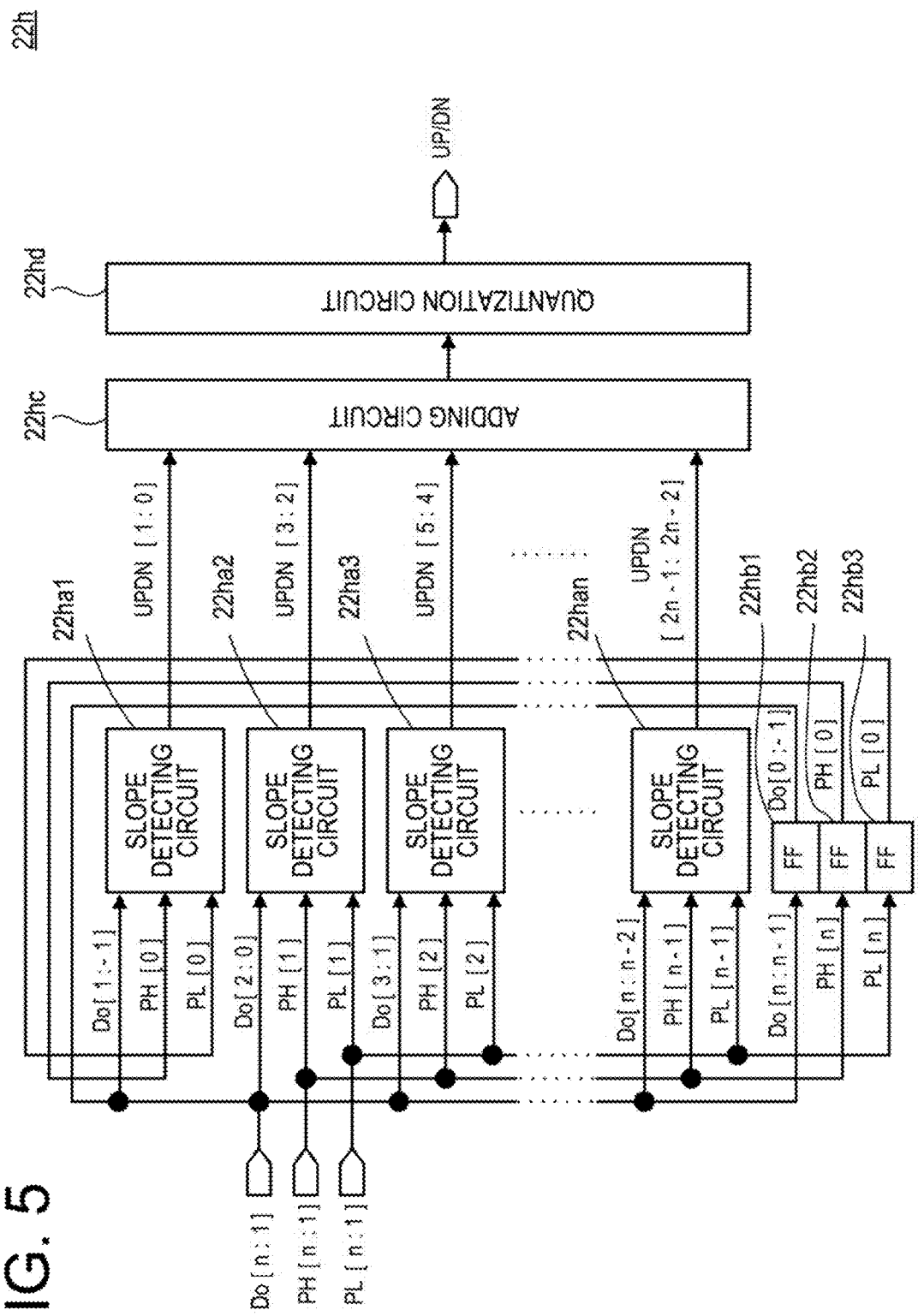
FIG. 5 is a diagram illustrating an example of a phase detecting circuit.

FIG. 5 is a diagram illustrating an example of the phase detecting circuit. The phase detecting circuit 22h includes slope detecting circuits 22ha1, 22ha2, 22ha3, . . . , and 22han, flip-flops (indicated by FF in FIG. 5) 22hb1, 22hb2, to and 22hb3, an adding circuit 22hc, and a quantization circuit 22hd.

Each of the slope detecting circuits 22ha1, 22ha2, 22ha3, . . . , and 22han receives a set by the values (a 6-bit value) of the three consecutive symbols in the output data signal Do of the number of bits of the n symbol portions (n≥4) output by the demultiplexer 22g. Further, each of the slope detecting circuits 22ha1 to 22han receives the comparison results of the comparing circuits 22d and 22e at the center symbol among the three symbols among the comparison results of the comparing circuits 22d and 22e of the number of bits of the n symbol portions output by the demultiplexer 22g. Further, each of the slope detecting circuits 22ha1 to 22han detects the eight data patterns in which the values of the three consecutive symbols are shifted in the slope shape and performs the phase difference detection based on the values of the three consecutive symbols and each comparison result.

For example, the slope detecting circuit 22ha1 receives the values Do[1:−1] of the three consecutive symbols, and the comparison results PL[0] and PH[0] of the comparing circuits 22d and 22e at the center symbol among the three symbols.

Among the values Do[1:−1], the values Do[0:−1] of the two temporally previous symbols are values Do[n:n−1] of two symbols at a most significant bit (MSB) side in the output data signal Do[m:1] in a previous cycle. Further, the comparison result PL[0] is a comparison result PL[n] at the symbol of the MSB in the comparison result PL[n:1] of the comparing circuit 22d in the previous cycle. Further, the comparison result PH[0] is a comparison result PL[n] at the symbol of the MSB in the comparison result PL[n:1] of the comparing circuit 22e in the previous cycle.

The slope detecting circuit 22ha1 detects the eight data patterns and performs the phase difference detection based on the value Do[1:−1] and the comparison results PL[0] and PH[0]. The slope detecting circuit 22ha1 outputs a signal UPDN[1:0] as a result of the phase difference detection.

The slope detecting circuit 22ha2 receives the values Do[2:0] of the to three consecutive symbols, and the comparison results PL[1] and PH[1] of the comparing circuits 22d and 22e at the center symbol among the three symbols. Further, the slope detecting circuit 22ha2 detects the eight data patterns and performs the phase difference detection based on the value Do[2:0] and the comparison results PL[1] and PH[1]. The slope detecting circuit 22ha2 outputs a signal UPDN[3:2] as a result of the phase difference detection.

The slope detecting circuit 22ha3 receives the values Do[3:1] of the three consecutive symbols, and the comparison results PL[2] and PH[2] of the comparing circuits 22d and 22e at the center symbol among the three symbols. Further, the slope detecting circuit 22ha3 detects the eight data patterns and performs the phase difference detection based on the value Do[3:1] and the comparison results PL[2] and PH[2]. The slope detecting circuit 22ha3 outputs a signal UPDN[5:4] as a result of the phase difference detection.

The slope detecting circuit 22han receives the values Do[n:n−2] of the three consecutive symbols, and the comparison results PL[n−1] and PH[n−1] of the comparing circuits 22d and 22e at the center symbol among the three symbols. Further, the slope detecting circuit 22han detects the eight data patterns and performs the phase difference detection based on the value Do[n:n−2] and the comparison results PL[n−1] and PH[n−1]. The slope detecting circuit 22han outputs a signal UPDN[2n−1:2n−2] as a result of the phase difference detection.

Each of the slope detecting circuits 22ha1 to 22han is, for example, a digital circuit implementing a truth value table described below. FIG. 6 is a diagram illustrating an example of a truth value table indicating an input/output of the slope detecting circuit.

In FIG. 6, an input/output of the slope detecting circuit 22ha2 is presented, but the same applies to other slope detecting circuits 22ha1, and 22ha3 to 22han. As an input, the values Do[2:0] of the three consecutive symbols are presented by values Do[0], Do[1], and Do[2] for each symbol. When the slope detecting circuit 22ha2 detects that the values Do[0], Do[1], and Do[2] have any one of the eight data patterns illustrated in FIG. 6, the slope detecting circuit 22ha2 outputs a signal UPDN[3:2] based on the comparison results PL[1] and PH[1]. The signal UPDN[3:2] includes three kinds including signals DN, UP, and STAY. Hereinafter, the signal DN is referred to as −1, the signal UP is referred to as +1, and the signal STAY is referred to as 0. The signal UPDN[3:2] may be indicated by 2 bits, and for example, −1 may be matched to 01, +1 may be matched to 11, and 0 may be matched to 00.

Figure 7:
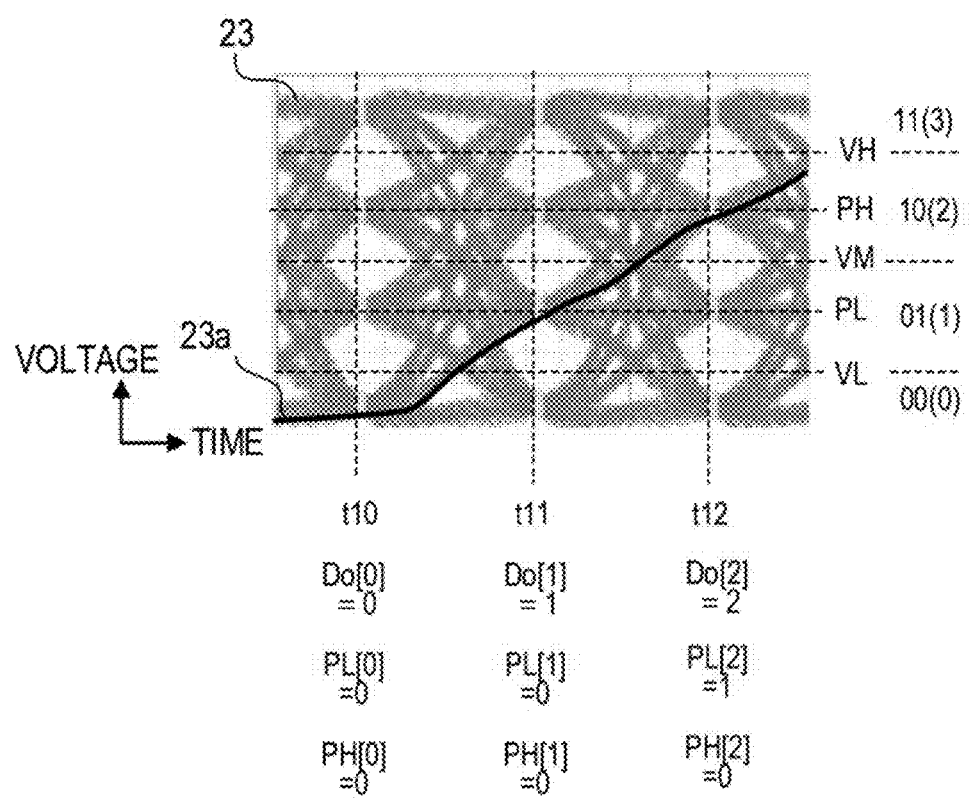
FIG. 7 is a diagram illustrating an example of phase difference detection in the case where a signal DN is output.

FIG. 7 is a diagram illustrating an example of phase difference detection in the case where a signal DN is output. The vertical axis represents voltage, and the horizontal axis represents time. In FIG. 7, the entire transition of the data signal Di of PAM4 at three consecutive symbols is indicated by an eye pattern 23. Further, in the data signal Di indicated by a waveform 23a, the values Do[0], Do[1], and Do[2] of the three symbols are 0, 1, and 2 and are shifted in a slope shape.

The values Do[0], Do[1], and Do[2] are determined by the comparing circuits 22a to 22c and the decoder 22f at timings t10, t11, and t12 of the clock signal CLK. Further, comparison results PL[0], PL[1], PL[2], PH[0], PH[1], and PH[2] are output by the comparing circuits 22d and 22e at the timings t10, t11, and t12.

When the value Do[0] is determined as 0, the value Do[1] is determined as 1, and the value Do[2] is determined as 2, one of eight data patterns represented in the truth value table illustrated in FIG. 6 is detected and a phase difference detection is performed based on the comparison results PL[1] and PH[1] in the slope detecting circuit 22ha2.

In the example of FIG. 7, the comparison results PL[1] and PH[1] are 0. In this case, the slope detecting circuit 22ha2 outputs a signal DN indicating the delay of the phase of the clock signal CLK as a signal UPDN[3:2], as represented in the truth value table of FIG. 6.

Figure 8:
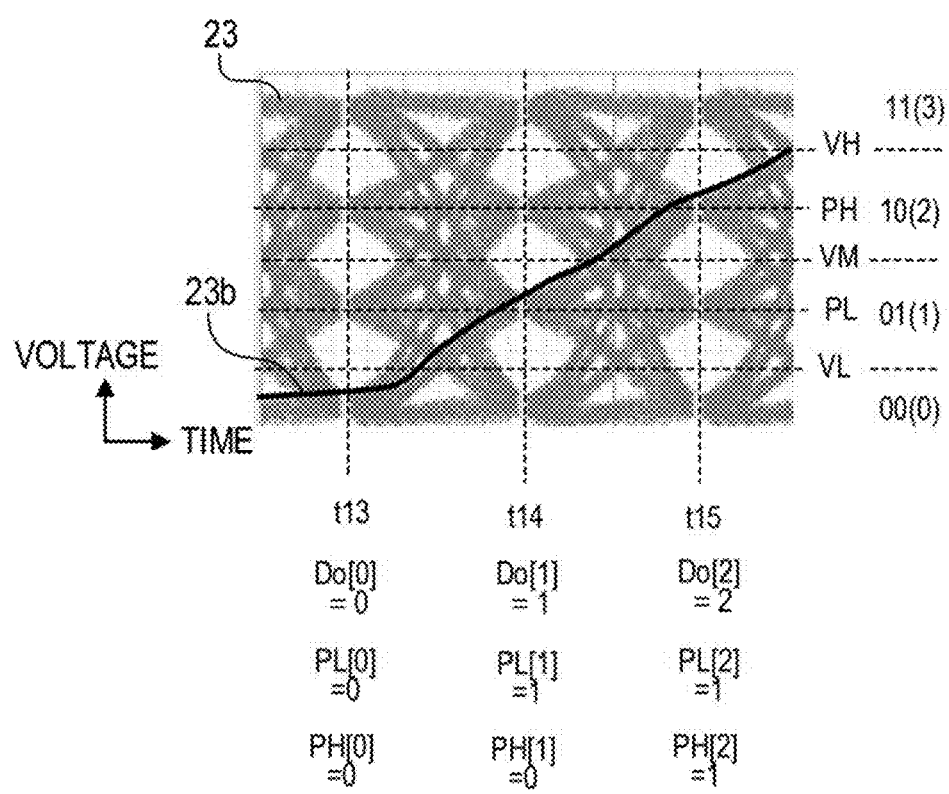
FIG. 8 is a diagram illustrating an example of phase difference detection in the case where a signal UP is output.

FIG. 8 is a diagram illustrating an example of phase difference detection in the case where the signal UP is output. The vertical axis represents in a voltage, and the horizontal axis represents time. In the same way as FIG. 7, in a data signal Di indicated by a waveform 23b of FIG. 8, the values Do[0], Do[1], and Do[2] of the three symbols are 0, 1, and 2 and are shifted in a slope shape.

The values Do[0], Do[1], and Do[2] are determined by the comparing circuits 22a to 22c and the decoder 22f at timings t13, t14, and t15 of the clock signal CLK. Further, comparison results PL[0], PL[1], PL[2], PH[0], PH[1], and PH[2] are output by the comparing circuits 22d and 22e at the timings t13, t14, and t15.

When the value Do[0] is determined as 0, the value Do[1] is determined as 1, and the value Do[2] is determined as 2, one of the eight data patterns represented in the truth value table illustrated in FIG. 6 is detected and a phase difference detection is performed based on the comparison results PL[1] and PH[1] in the slope detecting circuit 22ha2.

In the example of FIG. 8, the comparison results PL[1] is 1 and PH[1] is 0. In this case, the slope detecting circuit 22ha2 outputs a signal UP indicating the advance of the phase of the clock signal CLK as a signal UPDN[3:2], as represented in the truth value table of FIG. 6.

Figure 9:
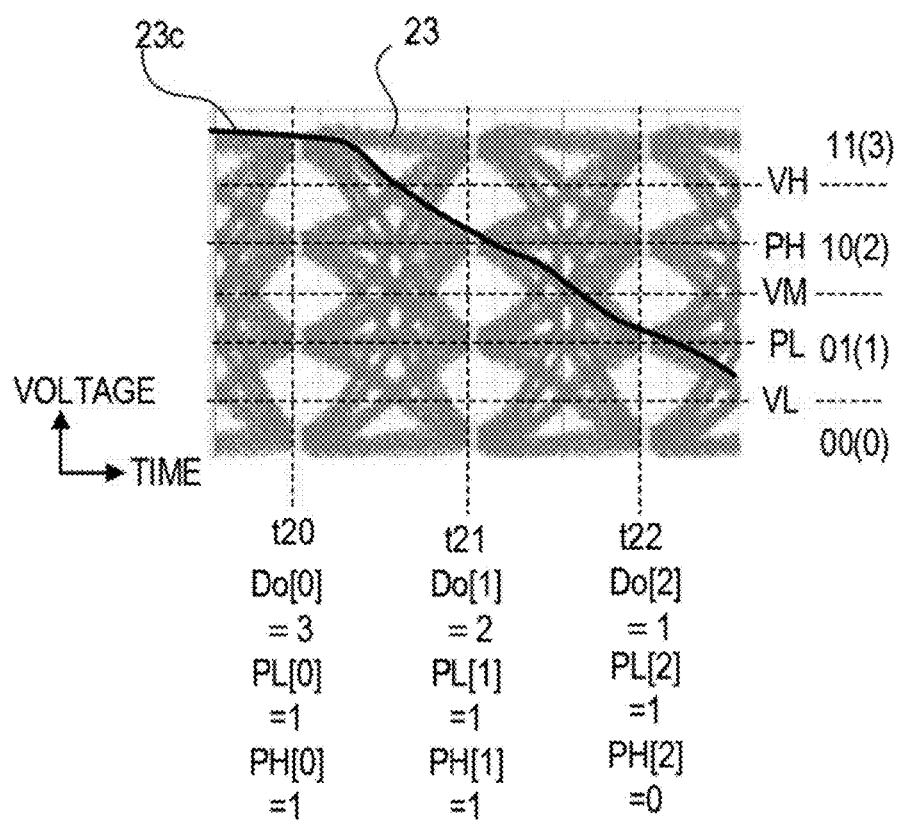
FIG. 9 is a diagram illustrating an example of phase difference detection when a separate data pattern is detected in the case where a signal DN is output.

FIG. 9 is a diagram illustrating an example of phase difference detection when a separate data pattern is detected in the case where a signal DN is output. The vertical axis represents a voltage, and the horizontal axis represents time. In a data signal Di indicated by a waveform 23c of FIG. 9, values Do[0], Do[1], and Do[2] of the three symbols are 3, 2, and 1 and are shifted in a slope shape.

The values Do[0], Do[1], and Do[2] are determined by the comparing circuits 22a to 22c and the decoder 22f at timings t20, t21, and t22 of the clock signal CLK. Further, comparison results PL[0], PL[1], PL[2], PH[0], PH[1], and PH[2] are output by the comparing circuits 22d and 22e at the timings t20, t21, and t22.

When the value Do[0] is determined as 3, the value Do[1] is to determined as 2, and the value Do[2] is determined as 1, one of the eight data patterns represented in the truth value table illustrated in FIG. 6 is detected and a phase difference detection is performed based on the comparison results PL[1] and PH[1] in the slope detecting circuit 22ha2.

In the example of FIG. 9, the comparison results PL[1] and PH[1] are 1. In this case, the slope detecting circuit 22ha2 outputs a signal DN indicating the delay of the phase of the clock signal CLK as a signal UPDN[3:2], as represented in the truth value table of FIG. 6.

Figure 10:
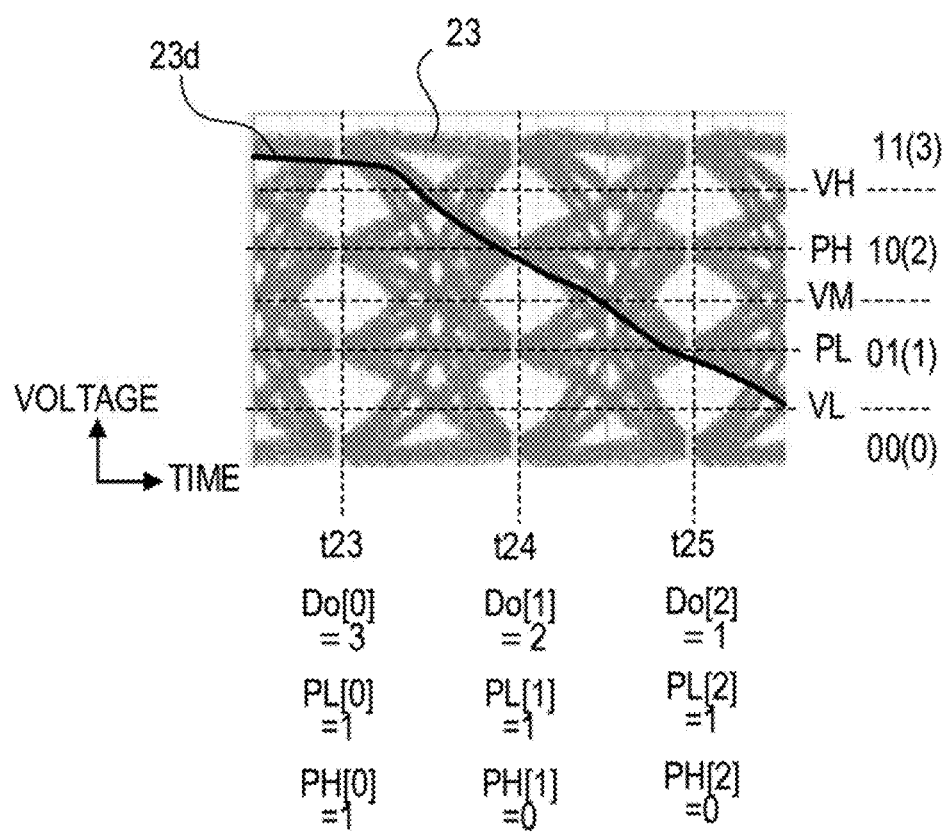
FIG. 10 is a diagram illustrating an example of phase difference detection when a separate data pattern is detected in the case where a signal UP is output.

FIG. 10 is a diagram illustrating an example of phase difference detection when a separate data pattern is detected in the case where a signal UP is output. The vertical axis represents a voltage, and the horizontal axis represents time. In the same way as FIG. 9, in a data signal Di indicated by a waveform 23d of FIG. 10, values Do[0], Do[1], and Do[2] of the three symbols are 3, 2, and 1 and are shifted in a slope shape.

The values Do[0], Do[1], and Do[2] are determined by the comparing circuits 22a to 22c and the decoder 22f at timings t23, t24, and t25 of the clock signal CLK. Further, comparison results PL[0], PL[1], PL[2], PH[0], PH[1], and PH[2] are output by the comparing circuits 22d and 22e at the timings t23, t24, and t25.

When the value Do[0] is determined as 3, the value Do[1] is determined as 2, and the value Do[2] is determined as 1, one of the eight data patterns represented in the truth value table illustrated in FIG. 6 is detected and phase difference detection is performed based on the comparison results PL[1] and PH[1] in the slope detecting circuit 22ha2.

In the example of FIG. 10, the comparison result PL[1] is 1, and the comparison result PH[1] is 0. In this case, the slope detecting circuit 22ha2 outputs a signal UP indicating the advance of the phase of the clock signal CLK as a signal UPDN[3:2], as represented in the truth value table of FIG. 6.

As represented in the truth value table of FIG. 6, when the values Do[0], Do[1], and Do[2] are not matched to the eight data patterns, the slope in detecting circuit 22ha2 outputs a signal STAY as the signal UPDN[3:2].

The description returns to the description with reference to FIG. 5. The flip-flop 22hb1 maintains a value Do[n:n−1] while being synchronized to an operation clock signal (not illustrated), and outputs the maintained value Do[n:n−1] as the value Do[0:−1]. The flip-flop 22hb2 maintains a comparison result PH[n] in synchronization with an operation clock signal (not illustrated), and outputs the maintained comparison result PL[n] as the comparison result PH[0]. The flip-flop 22hb3 maintains the comparison result PL[n] in synchronization with an operation clock signal (not illustrated), and outputs the maintained comparison result PH[n] as the comparison result PL[0].

The adding circuit 22hc outputs the adding result obtained by adding the signals UPDN[1:0] to UPDN[2n−1:2n−2] output by the slope detecting circuits 22ha1 to 22han. The quantization circuit 22hd quantizes the adding result output by the adding circuit 22hc in accordance with a bit width (e.g., p bits) that may be processed by the subsequent circuit (the filter 22i), and outputs a result of the quantization as the phase difference signal UP/DN. The quantization circuit 22hd may truncate the quantization error portion, integrate the quantization error portion, and use the integrated quantization error portion for a calculation of a next cycle in order to improve the noise immunity.

In the case where the values of the three consecutive symbols of the data signal Di have the eight data patterns, in the CDR circuit 22, the phase difference detection is performed and the phase difference signal UP/DN is output. That is, in the case where the eight data patterns are detected, the phase difference detection is performed. The detection rate of the phase difference detection is obtained as described below.

Figure 11:
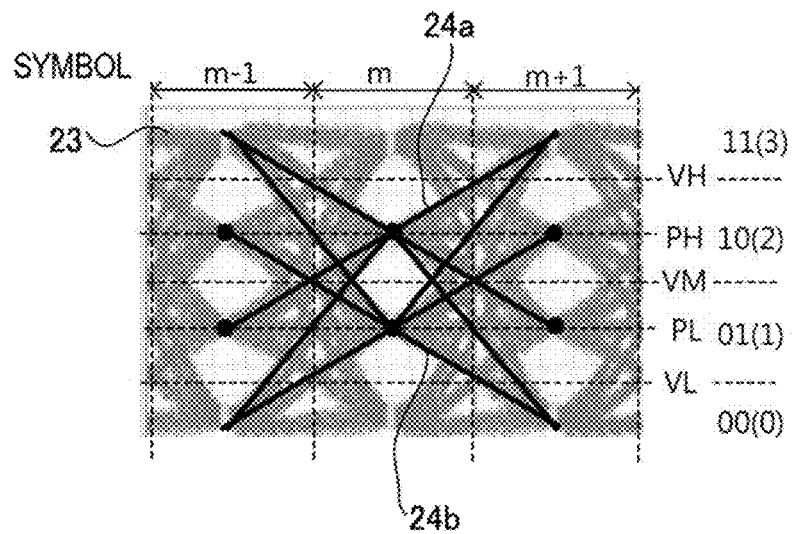
FIG. 11 is a diagram illustrating a detection rate of phase difference detection by the CDR circuit according to the second embodiment.

FIG. 11 is a diagram illustrating the detection rate of the phase difference detection by the CDR circuit according to the second embodiment. There are 64 patterns that the values of the three consecutive symbols m−1, m, and m+1 may take. In the CDR circuit 22, the phase difference detection is performed in the case where the eight data patterns are detected among the 64 patterns. FIG. 11 illustrates the eight data patterns. For example, a straight line 24a indicates a data pattern in which the values of the symbols (m−1, m, and m+1) are (1, 2, and 3), and are shifted in a slope shape. Further, a straight line 24b indicates a data pattern in which the values of the symbols (m−1, m, and m+1) are (2, 1, and 0), and are shifted in a slope shape.

In the CDR circuit 22, for each symbol, a detection is, performed as to whether a data pattern of the values of the three consecutive symbols obtained by combining two symbols temporally preceding the symbol is any one of the eight data patterns. The phase difference detection is performed when any one of the eight data patterns is detected, so that a detection rate of the phase difference detection is $3 \times 8/64 = 24/64$.

In the CDR circuit 22 of the second embodiment, the number of comparing circuits is five (ten when a half rate operation is performed) as illustrated in FIG. 1. As described above, a detection rate in the case where the number of comparing circuits is equally five in the MM-type or BB-type phase detecting circuit is $2/16$, but in the CDR circuit 22 of the second embodiment, the detection rate of three times of the detection rate of the foregoing case is obtained.

That is, the CDR circuit 22 of the second embodiment may suppress the detection rate from being decreased even when the number of comparing circuits for detecting the phase difference is decreased compared to the MM-type or BB-type phase detecting circuit in the related art. Accordingly, it is possible to decrease the number of comparing circuits and decrease power consumption.

Since the CDR circuit 22 performs the phase difference detection by using the two threshold values PL and PH, when any one of the data patterns that are more than those of the CDR circuit 10 of the first embodiment is detected, the CDR circuit 22 may perform the phase difference detection and further improve a detection rate.

(Example in Which the MM-Type Phase Detecting Circuit is Combined)

However, a detection rate of the phase difference detection may be further improved by combining the phase detecting circuit 22h illustrated in FIG. 5 and the MM-type phase detecting circuit.

Figure 12:
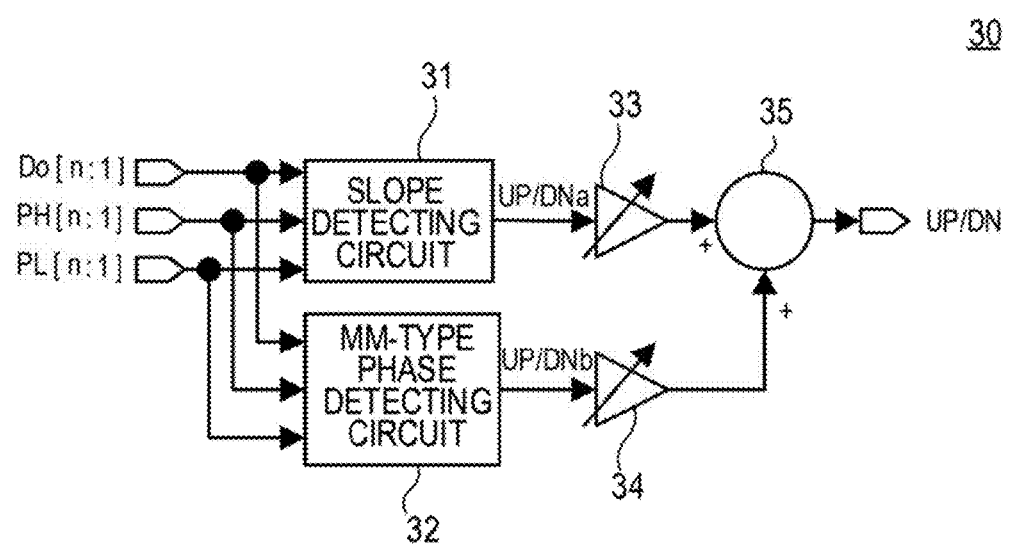
FIG. 12 is a diagram illustrating another example of the phase to detecting circuit.

FIG. 12 is a diagram illustrating another example of a phase detecting circuit. A phase detecting circuit 30 includes a slope detecting circuit 31, an MM-type phase detecting circuit 32, variable buffers 33 and 34, and an adding circuit 35.

The slope detecting circuit 31 includes each element of the phase detecting circuit 22h illustrated in FIG. 5, so that the slope detecting circuit 31 outputs a phase difference signal UP/DNa as a phase difference detection result. The MM-type phase detecting circuit 32 receives an output data signal DO[n:1] of the number of bits of n symbol portions output by a demultiplexer 22g, and comparison results PH[n:1] and PL[n:1] of the comparing circuits 22d and 22e, Further, the MM-type phase detecting circuit 32 outputs a phase difference signal UP/DNb based on values of every two consecutive symbols among the output data signal DO[n:1] and the comparison results PH[n:1] and PL[n:1].

Figure 13:
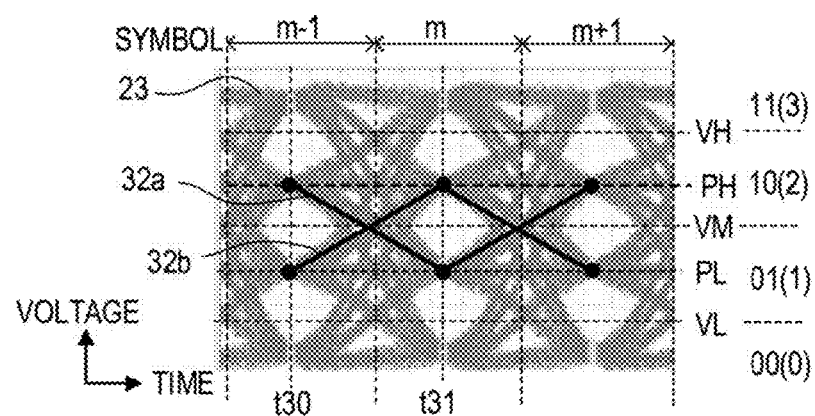
FIG. 13 is a diagram illustrating phase difference detection by an MM-type phase detecting circuit.

FIG. 13 is a diagram illustrating phase difference detection by the MM-type phase detecting circuit. The vertical axis represents a voltage, and the horizontal axis represents time. Data signals Di indicated by waveforms 32a and 32b make a transition that repeats 1 and 2 between consecutive symbols m−1, m, and m+1.

For example, the MM-type phase detecting circuit 32 performs a phase difference detection based on the result of a comparison between the waveforms 32a and 32b at determination timings (timings t30 and t31) at the symbols m−1 and m with respective threshold values.

The waveform 32a is a size between threshold values VM and VH at the timing t30, and a size between threshold values VM and VL at the timing t31. That is, the waveform 32a is changed to 2, 1. When the waveform 32a is smaller than the threshold value PH at the timing t30 and smaller than the threshold value PL at the timing t31, it is detected that the phase of a clock signal CLK is delayed with respect to the phase of a center of an eye of an eye pattern of the data signal Di. In the meantime, when the waveform 32a is larger than the threshold value PH at the timing t30 and larger than the threshold value PL at the timing t31, it is detected that the phase of the clock signal CLK is advanced with respect to the phase of the center of the eye of the eye pattern of the data signal Di.

The detection is performed based on the output data signal DO[n:1] of then symbol portions and the comparison results PH[n:1] and PL[n:1] supplied to the MM-type phase detecting circuit 32. The phase difference detection results for every two consecutive symbols among the n symbols are, for example, added, quantized, and output from the MM-type phase detecting circuit 32 as the phase difference signal UP/DNb in the same way as that of the phase detecting circuit 22h illustrated in FIG. 5.

In the phase detecting circuit 30 of FIG. 12, the variable buffer 33 performs a weighting on the phase difference signal UP/DNa output by the slope detecting circuit 31. The variable buffer 34 performs a weighting on the phase difference signal UP/DNb output by the MM-type phase detecting circuit 32.

The adding circuit 35 adds the output values of the variable buffers 33 and 34 and outputs the added value as a phase difference signal UP/DN. For example, when the weight of the phase difference detection in the slope detecting circuit 31 is equal to the weight of the phase difference detection in the MM-type phase detecting circuit 32, the variable buffers 33 and 34 multiply the phase difference signals UP/DNa and UP/DNb by 0.5 time, respectively (0.5 is multiplied as a weighting value). When the phase difference detection in the MM-type phase detecting circuit 32 is invalid, the variable buffer 33 multiplies the phase difference signal UP/DNa by one time (1 is multiplied as a weighting value), and the variable buffer 34 multiplies the phase difference signal UP/DNb by zero time (0 is multiplied as a weighting value).

In the reception circuit 20, the phase of the clock signal CLK controlled to converge based on the results of the phase difference detection by to the slope detecting circuit 31 and the MM-type phase detection circuit 32 is changed by the difference between the two detecting schemes or the characteristic of the data signal Di. Accordingly, the rate or weight for the results of the detection of both schemes may be adjusted so that the phase of the clock signal CLK converges on the phase of the center of the eye of the eye pattern. For example, a control circuit (not illustrated) changes the rate of weight in the variable buffers 33 and 34, and a measuring circuit (not illustrated) measures an input jitter tolerance for each rate. The rate when the input jitter tolerance obtained by the measurement is best is used.

The phase detecting circuit 30 illustrated in FIG. 12 is used instead of the phase detecting circuit 22h illustrated in FIG. 5, so that it is possible to further improve a detection rate without increasing the number of comparing circuits. In the MM-type phase detecting circuit 32, the phase difference detection is performed 16 times in the case where the values at the symbols m−1, m, and m+1 illustrated in FIG. 13 are (1, 2, and x), (2, 1, and x), (x, 1, and 2), or (x, 2, and 1) (x is 0, 1, 2, or 3). Among them, the four data patterns including (1, 2, and 3), (2, 1, and 0), (0, 1, and 2), and (3, 2, and 1) overlap with the data patterns detected by the slope detecting circuit 31. At the three consecutive symbols m−1, m, and m+1, the MM-type phase detecting circuit 32 has two time opportunities of the phase difference detection, so that the detection rate in the case where the phase detecting circuit 30 is used is $(16-4)/(2\times 64)+{}^{24}\!/\!_{64}={}^{30}\!/\!_{64}$, which is about ½ of the detection rate.

Third Embodiment (Reception Circuit)

In the foregoing, the data signal Di is the data signal of PAM4, but is not limited thereto, and the data signal Di may be a data signal having more values (e.g., a data signal of PAM8 or PAM16).

Figure 14:
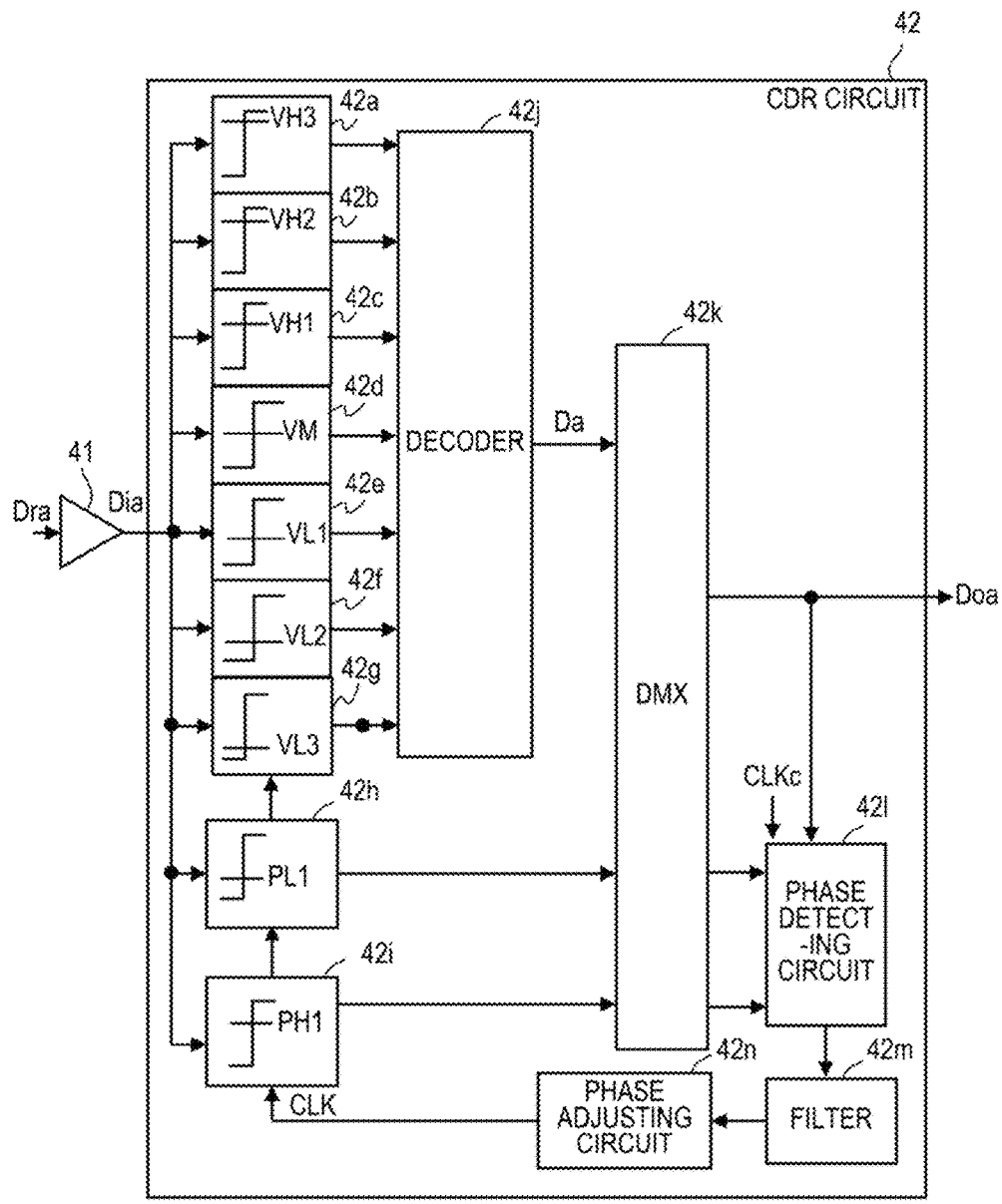
FIG. 14 is a diagram illustrating an example of a reception circuit and a CDR circuit according to a third embodiment.

In this case, the number of threshold values for the data determination is increased, so that the comparing circuits are provided in to accordance with the number of threshold values. FIG. 14 is a diagram illustrating an example of a reception circuit and a CDR circuit according to a third embodiment. In FIG. 14, the same element as that of the reception circuit 20 illustrated in FIG. 4 is denoted by the same reference numeral.

The reception circuit 40 of the third embodiment includes an equalization circuit 41 and a CDR circuit 42. The equalization circuit 41 receives a data signal Dra of PAM8 in which a 3-bit value is matched to each of 8 potential levels divided by threshold values VH3, VH2, VH1, VM, VL1, VL2, and VL3, performs equalization processing on the received data signal Dra, and outputs the equalization processed data signal Dra as a data signal Dia. Further, in the seven threshold values, all of the differences (potential differences) between two threshold values having adjacent sizes is the same.

The CDR circuit 42 includes comparing circuits 42a, 42b, 42c, 42d, 42e, 42f, 42g, 42h, and 42i, a decoder 42j, a demultiplexer 42k, a phase detecting circuit 42l, a filter 42m, and a phase adjusting circuit 42n.

The comparing circuits 42a to 42g output the results of the comparison between the data signal Di and the seven threshold values at a timing synchronized to the clock signal CLK. The decoder 42j outputs a 3-bit value of each symbol of the data signal Dia as a determination result Da based on the comparison results output by the comparing circuits 42a to 42g.

The comparing circuit 42h outputs the result of the comparison between the data signal Dia and the threshold value PL1 at the timing synchronized to the clock signal CLK. The comparing circuit 42i outputs the result of the comparison between the data signal Dia and the threshold value PH1 at the timing synchronized to the clock signal CLK.

The threshold values PL1 and PH1 are threshold values for detecting a phase difference. The threshold value PL1 is set to, for example, a value (voltage value) having an intermediate size between the threshold value VM and the threshold value VL1. Further, the threshold value PH1 is set to, for example, a value having an intermediate size between the threshold value VM and the threshold value VH1. Further, the threshold value PL1 may also be set to a value having an intermediate size between the threshold value VL2 and the threshold value VL3, and may also be set to a value having an intermediate size between the threshold value VL1 and the threshold value VL2. That is, the threshold value PL1 is set to a value having an intermediate size between one threshold value among seven threshold values for determining data and a threshold value having a size closest to a size of the threshold value. The same applies to the threshold value PH1. That is, the threshold value PH1 may also be set to a value having an intermediate size between the threshold value VH2 and the threshold value VH3, and may also be set to a value having an intermediate size between the threshold value VH1 and the threshold value VH2.

Further, when the CDR circuit 42 performs a half rate operation, two of each of the comparing circuits 42a to 42i are provided. The demultiplexer 42k demultiplexes each of the determination result Da and the comparison results output by the comparing circuits 42h and 42i to the number of bits of the n symbol portions.

The phase detecting circuit 42l receives an output data signal Doa of the n symbol portions output by the demultiplexer 42k. Further, the phase detecting circuit 42l detects a data pattern in which the values of the three consecutive symbols are shifted slope shape, based on the output data signal Doa.

The phase detecting circuit 42l of the CDR circuit 42 processing the data signal Dia of the PAM8 detects 48 data patterns, and performs the phase difference detection when the data patterns are detected. The functions of the filter 42m and the phase adjusting circuit 42n are the same as those of the filter 22i and the phase adjusting circuit 22j illustrated in FIG. 4.

Figure 15:
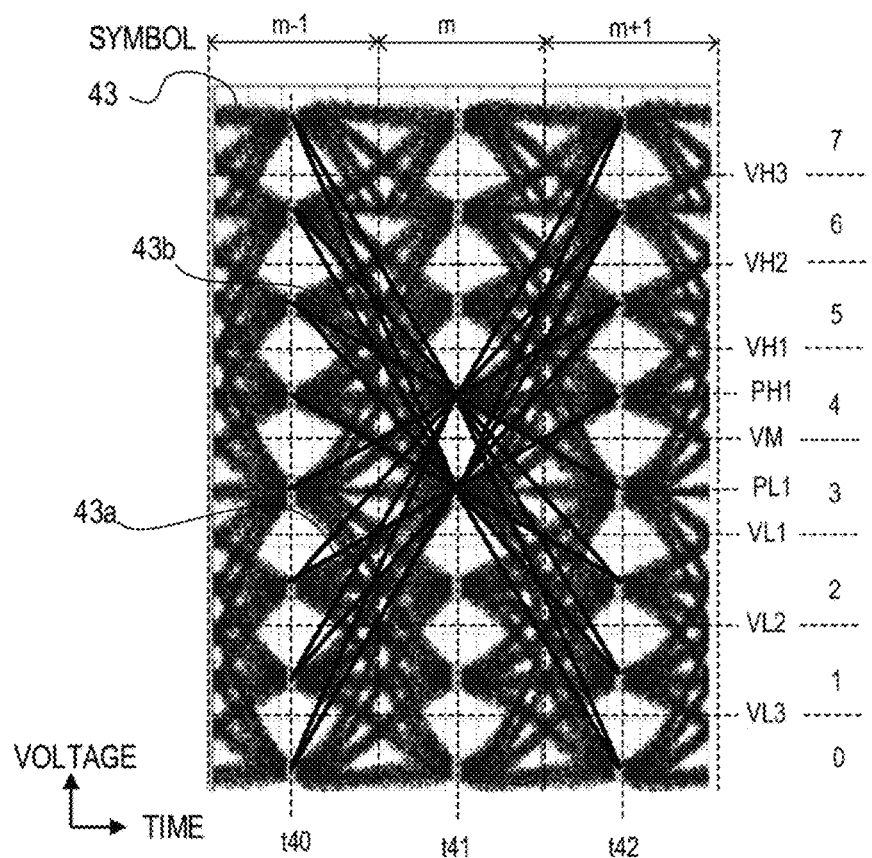
FIG. 15 is a diagram illustrating data determination and phase difference detection of a data signal of PAM8.

FIG. 15 is a diagram illustrating data determination of a data signal of the PAM 8 and phase difference detection. In FIG. 15, the entire transition of to a data signal Dia of the DAM8 at three consecutive symbols m−1, m, and m+1 is indicated by an eye pattern 43. Further, in FIG. 15, the 48 data patterns in which the values of the symbols (m−1, m, and m+1) are shifted in a slope shape are indicated by straight lines.

Details of the 48 data patterns are described below. First, there are 12 data patterns in which the value of the symbol m−1 is any one of 1, 2, and 3, the value of the symbol m is 3, and the value of the symbol m+1 is any one of 4, 5, 6, and 7. Further, there are 12 data patterns in which the value of the symbol m−1 is any one of 0, 1, 2, and 3, the value of the symbol m is 4, and the value of the symbol m+1 is any one of 5, 6, and 7. Further, there are 12 data patterns in which the value of the symbol m−1 is any one of 4, 5, 6, and 7, the value of the symbol m is 3, and the value of the symbol m+1 is any one of 0, 1, and 2. Further, there are 12 data patterns in which the value of the symbol m−1 is any one of 5, 6, and 7, the value of the symbol m is 4, and the value of the symbol m+1 is any, one of 0, 1, 2, and 3.

For example, the straight line 43a indicates a data pattern in which the values of the symbols (m−1, m, and m+1) are (2, 3, and 4), and are shifted in a slope shape, and the straight line 43b indicates a data pattern in which the values of the symbols (m−1, m, and m+1) are (5, 4, and 3), and are shifted in a slope shape.

The phase detecting circuit 42l performs a detection of the data pattern illustrated in FIG. 15 based on the results of the comparison between the data signal Dia and the seven threshold values for determining data at the determination timings (timings t40, t41, and t42) of the data of the symbols m−1, m, and m+1. Further, the phase detecting circuit 42l outputs a phase difference signal UP/DN based on the results of the comparison between the data signal Dia and the threshold values PL1 and PH1 at the determination timing (timing t41) of the data of the symbol m when any one of the data patterns is detected.

For example, in the case where the data pattern indicated by the straight line 43a is detected, when the data signal Dia at the timing t41 is smaller than the threshold value PL, the phase detecting circuit 42l outputs a signal DN as the phase difference signal UP/DN. When the data signal Dia at the timing t41 is larger than the threshold value PL, the phase detecting circuit 42l outputs a signal UP as the phase difference signal UP/DN.

In the CDR circuit 42 of the third embodiment, a detection rate of the phase difference detection is obtained as described below. In the data signal Dia of the PAM8, there are 512 data patterns that the values of the three consecutive symbols m−1, m, and m+1 may take. In the CDR circuit 42, the phase difference detection is performed when the 48 data patterns among 512 patterns are detected.

In the CDR circuit 42, for each symbol, the detection is performed as to whether a data pattern of the values of the three consecutive symbols obtained by combining the two symbols temporally preceding the symbol is any one of the 48 data patterns. The phase difference detection is performed when any one of the 48 data patterns is detected, so that a detection rate of the phase difference detection is 3×48/512=144/512.

Figure 16:
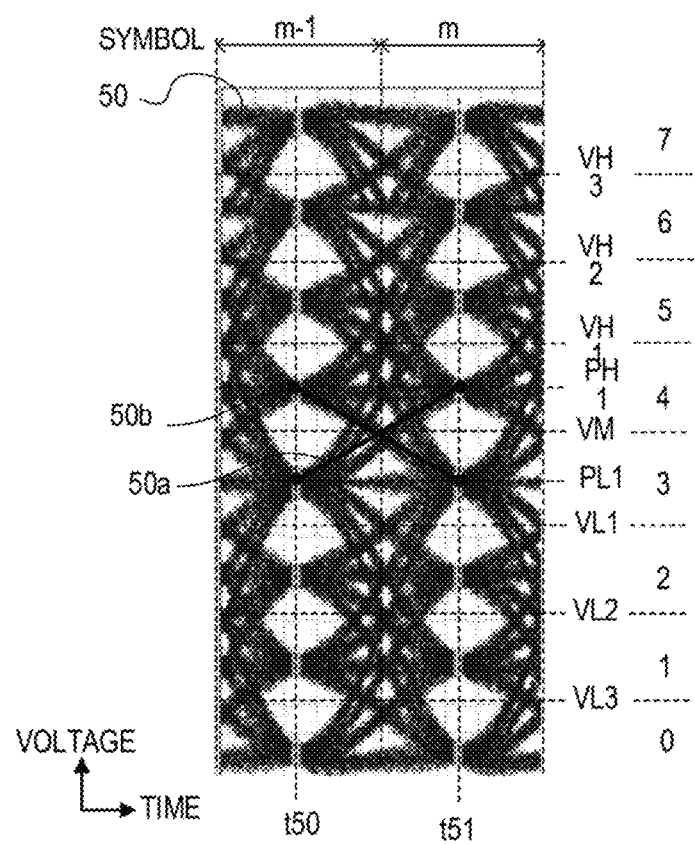
FIG. 16 is a diagram illustrating the detection rate of phase difference detection by the MM-type phase detecting circuit.

In this regard, a detection rate in the case where the MM-type phase detecting circuit is used is described below. FIG. 16 is a diagram illustrating a detection rate of phase difference detection by the MM-type phase detecting circuit. The vertical axis represents a voltage, and the horizontal axis represents time.

In FIG. 16, the entire transition of a data signal Dia of the PAM8 at two consecutive symbols m−1 and m is indicated by an eye pattern 50. Further, the straight lines 50a and 50b indicate the data patterns in which the values of the symbols m−1 and m are changed in two types including 3 and 4, and 4 and 3.

The MM-type phase detecting circuit compares the data signal Dia with seven threshold values for determining data and threshold values PL1 and PH1 for detecting the phase difference at the determining times (timings t50 and t51) of data of the symbols m−1 and m. Further, the MM-type phase detecting circuit outputs a phase difference signal UP/DN based on the comparison results.

In the MM-type phase detecting circuit, the number of comparing circuits which compare the threshold values and the data signal Dia, respectively, is 9 (18 when the MM-type phase detecting circuit performs a half rate operation). Further, there are 64 data patterns that the values of the two consecutive continuous symbols may take, and in the MM-type phase detecting circuit, for every two symbols, the phase difference detection is performed in the case where two data patterns among the 64 patterns are detected so that a detection rate is 2/16.

Although not illustrated, the same relationship between the number of comparing circuits and a detection rate applies to the BB-type phase detecting circuit. In the CDR circuit 42 of the third embodiment, the number of comparing circuits is 9 (18 when a half rate operation is performed) as illustrated in FIG. 14. As described above, the detection rate in the case where the number of comparing circuits in the MM-type or BB-type phase detecting circuit is equally 9 is 2/16, but in the CDR circuit 42 in the third embodiment, the detection rate of two or more times the detection rate of the foregoing case is obtained.

That is, even in the CDR circuit 42 of the third embodiment, even when the number of comparing circuits for detecting a phase difference is decreased to be smaller than that of the MM-type or BB-type phase detecting circuit in the related art, it is possible to suppress the detection rate from being decreased. Accordingly, it is possible to decrease the number of comparing circuits and power consumption.

In the example of the CDR circuit 42 illustrated in FIG. 14, two comparing circuits 42h and 42i are provided, but one comparing circuit may be provided. Further, the threshold value for detecting a phase difference may be to further set to any one or more of a value between the threshold values VH1 and VH2, a value between the threshold values VH2 and VH3, and a value between the threshold values VL1 and VL2, or between the threshold values V2 and V3. In this case, the number of comparing circuits is increased, but when any one of the more data patterns is detected, the phase difference detection is performed, SO that an opportunity of the phase difference detection is increased and the detection rate is further improved.

For the phase detecting circuit 42l, the MM-type phase detecting circuit may be combined as illustrated in FIG. 12. In the foregoing, the one aspect of the CDR circuit and the reception circuit of the present disclosure has been described based on the embodiments, but this is simply the example, and the present disclosure is not limited thereto.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock data recovery (CDR) circuit, comprising:
   a data determination circuit configured to determine a value of a data signal, based on a first comparison result of comparing the data signal with three or more first threshold values at a timing synchronized with a clock signal so as to generate a determination result, the data signal having data on which two or more bits are matched to a plurality of electric potential levels into which an to electric potential of the data signal is divided by the three or more first threshold values;
   a first comparison circuit configured to compare the data signal with a second threshold value at the timing synchronized with the clock signal so as to generate a second comparison result;

a first phase detection circuit coupled with the data determination circuit and the first comparison circuit, and configured to detect data patterns in which a first symbol, a second symbol and a third symbol of a plurality of symbols to which the data signal is modulated are temporally consecutive, based on the determination result, the data patterns forming that a value of the second symbol is larger than a value of the first symbol and smaller than a value of the third symbol, or the value of the second symbol is smaller than the value of the first symbol and larger than the value of the third symbol, wherein, when the first phase detection circuit detects the data pattern, the first phase detection circuit generates a first phase difference signal for controlling a phase of the clock signal to advance or delay, based on the second comparison result at the second symbol; and a phase adjustment circuit configured to adjust the phase of the clock signal, based on the first phase difference signal.

2. The CDR circuit according to claim 1, wherein the second threshold value is an intermediate value between a third threshold value that is one of the three or more first threshold values and a fourth threshold value that is one of the three or more first threshold values and has a size closest to a size of the third threshold value.

3. The CDR circuit according to claim 1, further comprising:

a plurality of comparison circuits configured to include the first comparison circuit, and compare the data signal with each of a plurality of different fifth threshold values including the second threshold value at the timing to synchronized with the clock signal so as to generate a third comparison result, wherein, when the first phase detection circuit detects the data pattern, the first phase detection circuit generates the first phase difference signal, based on the third comparison result at the second symbol.

4. The CDR circuit according to claim 1, wherein the first phase detection circuit is configured to include a second phase detection circuit to generate a second phase difference signal for controlling the phase of the clock signal to advance or delay, based on the determination result and the second comparison result for each of a fourth symbol and a fifth symbol of the plurality of symbols, and wherein the first phase detection circuit is configured to add the first phase difference signal and the second phase difference signals so as to adjust the phase of the clock signal.

5. The CDR circuit according to claim 4, wherein the first phase detection circuit weights each of the first phase difference signal and the second phase difference signal with a first ratio and adds the weighted first phase difference signal and the weighted second phase difference signal so as to adjust the phase of the clock signal.

6. The CDR circuit according to claim 1, wherein the first phase detection circuit adds a plurality of first phase difference signals obtained for each of the plurality of sets by three consecutive symbols included in four or more consecutive symbols of the plurality of symbols to which the data signal is modulated are temporally consecutive, and quantizes the added plurality of first phase difference signals so as to adjust the phase of the clock signal.

7. A reception circuit, comprising:

an equalization circuit configured to receive a first data signal having data on which two or more bits are matched to a plurality of electric potential levels into which an electric potential of the first data signal is divided by three or more first threshold values, and perform equalization processing on the first data signal so as to generate a second data signal;

a data determination circuit configured to receive the second data signal, and determine a value of the second data signal, based on a first comparison result of comparing the second data signal with the three or more first threshold values at a timing synchronized with a clock signal so as to generate a determination result;

a first comparison circuit configured to compare the second data signal with a second threshold value at the timing synchronized with the clock signal so as to generate a second comparison result;

a phase detection circuit coupled with the data determination circuit and the first comparison circuit, and configured to detect data patterns in which a first symbol, a second symbol and a third symbol of a plurality of symbols to which the second data signal is modulated are temporally consecutive, based on the determination result, the data patterns forming that a value of the second symbol is larger than a value of the first symbol and smaller than a value of the third symbol, or the value of the second symbol is smaller than the value of the first symbol and larger than the value of the third symbol, wherein, when the first phase detection circuit detects the data pattern, the phase detection circuit generates a phase difference signal for controlling a phase of the clock signal to advance or delay, based on the second comparison result at the second symbol; and a phase adjustment circuit configured to adjust the phase of the clock signal, based on the phase difference signal.

* * * * *